United States Patent [19]

Azuma et al.

[11] Patent Number: 4,853,929
[45] Date of Patent: Aug. 1, 1989

[54] ELECTRONIC CIRCUIT DEVICE ABLE TO DIAGNOSE STATUS-HOLDING CIRCUITS BY SCANNING

[75] Inventors: Isao Azuma, Fujiidera; Miyuki Ishida; Naozumi Aoki, both of Kawasaki, all of Japan

[73] Assignee: Fujitsu Limited, Kawasaki, Japan

[21] Appl. No.: 164,483

[22] Filed: Mar. 4, 1988

[30] Foreign Application Priority Data

Mar. 6, 1987 [JP] Japan ................................ 62-051562
May 9, 1987 [JP] Japan ................................ 62-112963

[51] Int. Cl.⁴ ..................................... G01R 31/28
[52] U.S. Cl. ............................... 371/25; 371/15
[58] Field of Search ................. 371/15, 25; 324/73 R

[56] References Cited

U.S. PATENT DOCUMENTS 4,698,588 10/1987 Hwang et al. .................. 324/73 R
4,701,921 10/1987 Powell et al. ..................... 371/25
4,703,484 10/1987 Rolfe et al. ....................... 371/25
4,710,931 12/1987 Bellay et al. ...................... 371/25
4,710,933 12/1987 Powell et al. ..................... 371/25

Primary Examiner—Charles E. Atkinson
Attorney, Agent, or Firm—Staas & Halsey

[57] ABSTRACT

An electronic circuit device able to diagnose a status-holding circuit by scanning, the device comprising a first plurality of integrated circuits each including a serial scan circuit for receiving serial data, generating an address value of a target status-holding circuit as parallel data from the received serial data, and selecting the target status-holding circuit having the generated address value, and a second plurality of integrated circuits each including a parallel scan circuit for receiving an address value of a target status-holding circuit as parallel data and selecting the target status-holding circuit having the received address value. Address information received as serial data being used for generating parallel address information, and address information received as parallel data being used for generating serial address information.

13 Claims, 16 Drawing Sheets

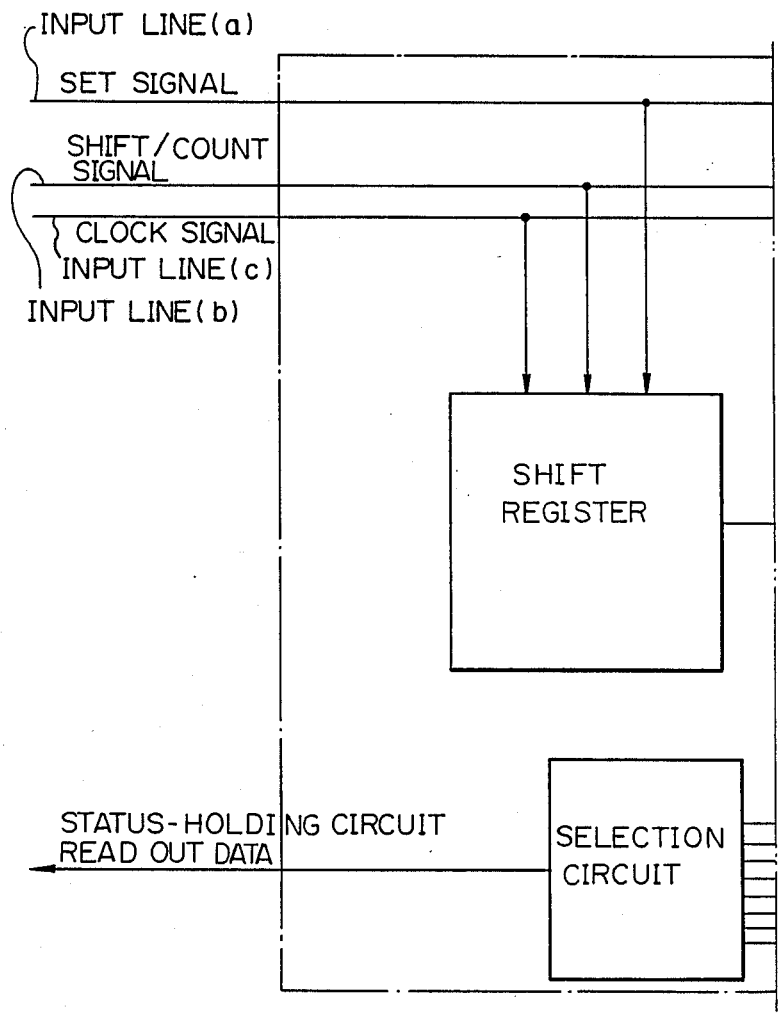

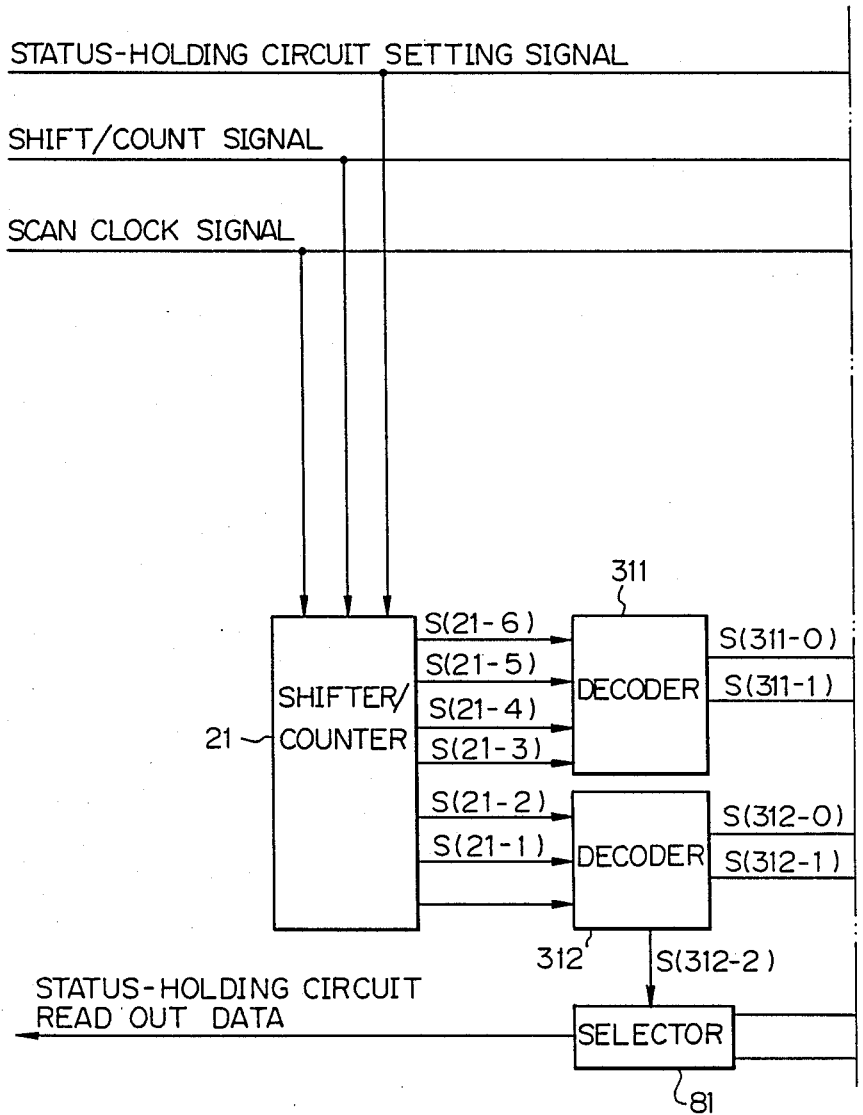

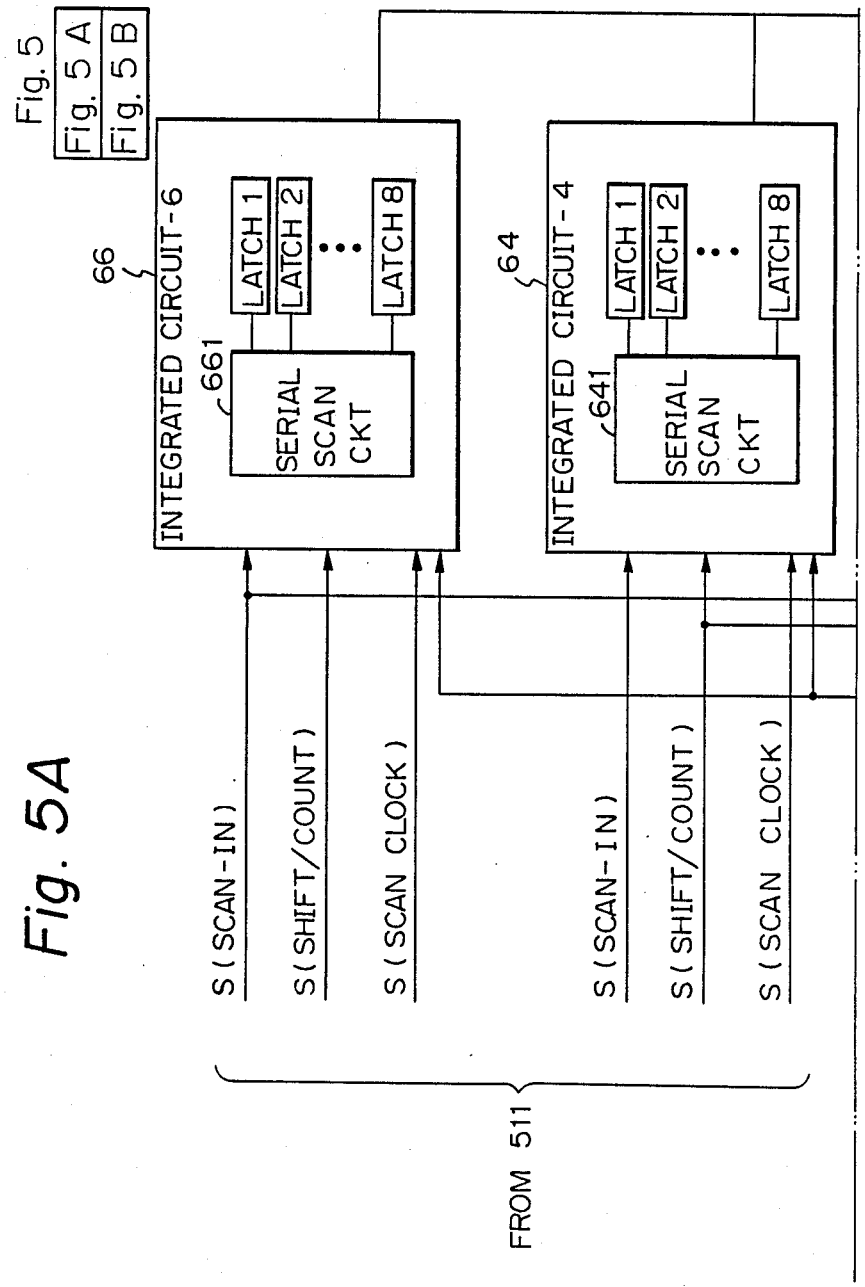

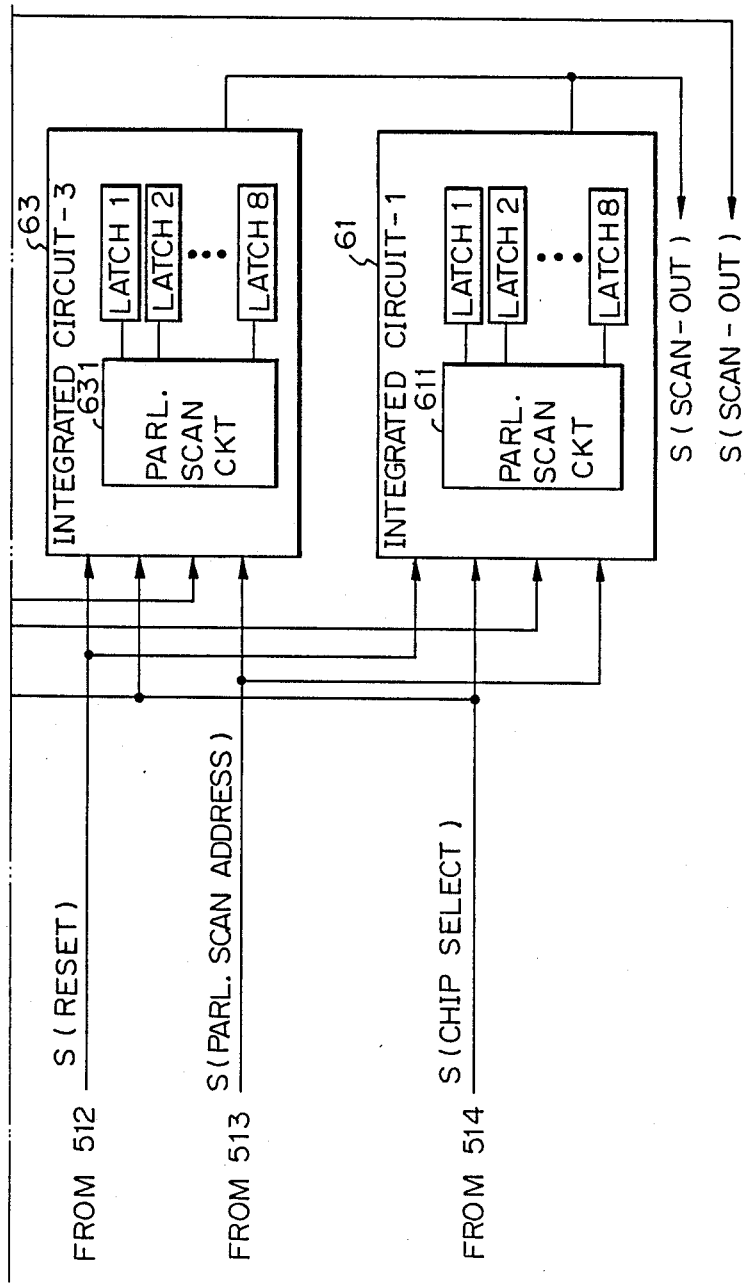

| Fig. 7A | Fig. 7B |

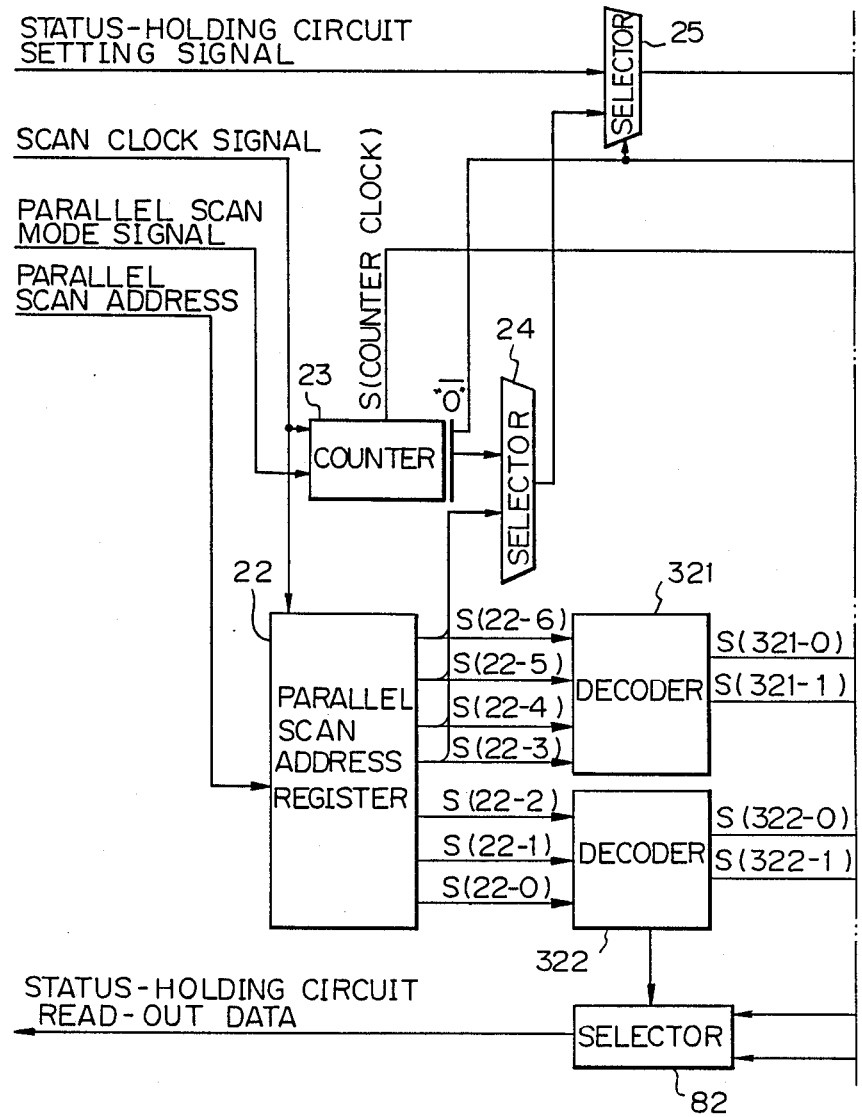

ELECTRONIC CIRCUIT DEVICE ABLE TO DIAGNOSE STATUS-HOLDING CIRCUITS BY SCANNING

BACKGROUND OF THE INVENTION

1. Field of the Invention

The present invention relates to an electronic circuit device able to carry out a diagnosis of status-holding circuits in the electronic circuit device by scanning. Usually, in the diagnosis of status-holding circuits in an electronic circuit device, a scanning is carried out to read data from status-holding circuits such as latch circuits, flip-flop circuits, and the like, or to write data into these status-holding circuits.

2. Description of the Related Arts

In general, in the diagnosis of status-holding circuits in an electronic circuit device, a parallel scanning method in which a scan address is supplied in parallel to a plurality of address signal lines corresponding to the number of bits of a scan address, and a serial scanning method in which a scan address is supplied successively through a signal line to a serial-parallel converter and converted into a parallel scan address and then fed to a status-holding circuit, are used.

However, in the parallel scanning method, when a large number of status-holding circuits must be scanned, a large number of address signal lines must be provided for supplying scan addresses; which increased number of address signal lines is disadvantageous.

In the serial scanning method, a large amount of hardware is needed for the serial-parallel conversion of scan addresses, and such an increased amount of hardware is also disadvantageous.

SUMMARY OF THE INVENTION

An object of the present invention is to provide an improved electronic circuit device able to diagnose a status-holding circuit by scanning, in which a parallel scan system and a serial scan system are integrated in an electronic circuit device, and accordingly the design of the hardware of the electronic circuit device is optimized when considering whether a sufficient number of terminal pads is available and whether a sufficient space is available for logic circuit elements.

Another object of the present invention is to utilize the advantages of both a parallel scan system and a serial scan system to enable an increase of the number of elements to be included in an integrated circuit, in the cases where an appreciable number of terminal pads and where only a limited number of terminal pads are provided in the integrated circuit.

Still another object of the present invention is to integrate a parallel scan system and a serial scan system to increase the freedom of design choice for an electronic circuit device in the form of an integrated circuit.

Instead of the conventional design of a large scale integrated circuit device in which unification either to an exclusive use of serial scanning type integrated circuits or an exclusive use of parallel scanning type integrated circuits is carried out, the mixed use of serial scanning type and parallel scanning type integrated circuits according to the present invention makes it possible to mount as many circuit elements as possible on an integrated circuit to fully utilize the space of the integrated circuit under the condition of a given number of terminal pads, so that the limitation in design of the large scale integrated circuit device caused by the exclusive unification of the scanning type is eliminated and the total number of the integrated circuits for the large scale integrated circuit device is reduced.

In accordance with an aspect of the present invention, there is provided an electronic circuit device able to diagnose a status-holding circuit by scanning, the device including a first plurality of integrated circuits each including a serial scan circuit and a plurality of status-holding circuits to be scanned, the serial scan circuit receiving serial data, generating an address value of a target status-holding circuit as parallel data from the received serial data, and selecting the target status-holding circuit having the generated address value, and a second plurality of integrated circuits each including a parallel scan circuit and a plurality of status-holding circuits to be scanned, the parallel scan circuit receiving an address value of a target status-holding circuit as parallel data and selecting the target status-holding circuit having the received address value. The electronic circuit also includes a serial-parallel converter unit for receiving a serially supplied address signal and converting the received signal into a parallel address signal, a first decoder unit, connected to the serial-parallel converter unit, for decoding a first part of the parallel address signal and providing a plurality of chip select signals each corresponding to one of the first and second plurality of integrated circuits, respectively, a first distributing unit for receiving a second part of the parallel address signal and distributing this second part to each of the second plurality of integrated circuits, and a second distributing unit for receiving the serially supplied address signal and distributing this signal to each of the first plurality of integrated circuits.

In accordance with another aspect of the present invention, there is provided an electronic circuit device able to diagnose a status-holding circuit by scanning, the device including a first plurality of integrated circuits each including a serial scan circuit and a plurality of status-holding circuits to be scanned, the serial scan circuit receiving serial data, generating an address value of a target status-holding circuit as parallel data from the received serial data, and selecting the target status-holding circuit having the generated address value, and a second plurality of integrated circuits each including a parallel scan circuit and a plurality of status-holding circuits to be scanned, the parallel scan circuit receiving an address value of a target status-holding circuit as parallel data and selecting the target status-holding circuit having the received address value. The electronic circuit also includes a parallel-serial converting unit for converting a first part of a supplied parallel address signal into a serial address signal, a first distributing unit for distributing the serial address signal to each of the first plurality of integrated circuits, a first decoder unit for decoding a second part of the supplied parallel address signal and providing a plurality of chip select signal each corresponding to one of the first and second plurality of integrated circuits, respectively, and a second distributing unit for receiving the first part of the supplied parallel address and distributing this first part to each of the second plurality of integrated circuits.

BRIEF DESCRIPTION OF THE DRAWINGS

In the drawings.

FIG. 5, comprised of FIGS. 5A and 5B, shows the structure of the integrated circuits in the device of FIG. 4;

DESCRIPTION OF THE PREFERRED EMBODIMENTS

Figure 1:
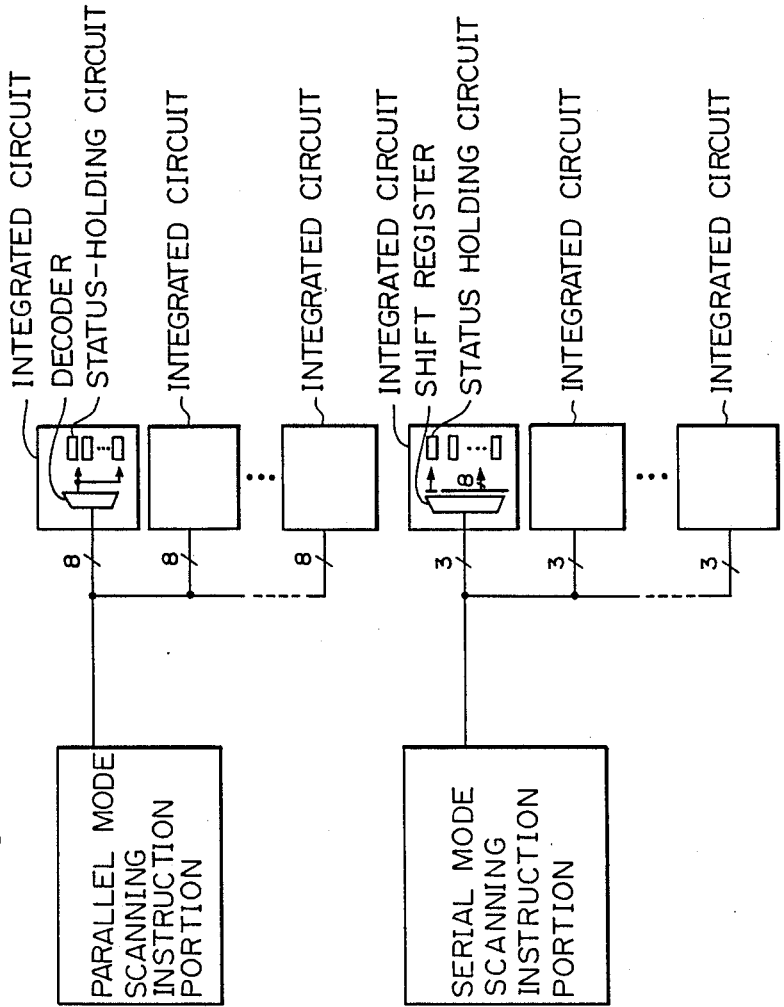
FIG. 1 illustrates in general the scanning for the diagnosis of status-holding circuits in electronic circuit devices in the form of an integrated circuit.

Before describing preferred embodiments, prior art arrangements for a diagnosis by scanning are explained with reference to FIG. 1, FIG. 2, and FIG. 3. In general, the scanning for a diagnosis of status-holding circuits in electronic circuit devices in the form of integrated circuit can be as illustrated in FIG. 1. The parallel mode scanning instruction portion instructs a parallel scanning for a sequence of integrated circuits having a plurality of status-holding circuits such as latch circuits. The serial mode scanning instruction portion instructs a serial scanning for a sequence of integrated circuits having a plurality of status-holding circuits such as latch circuits.

Figure 2:
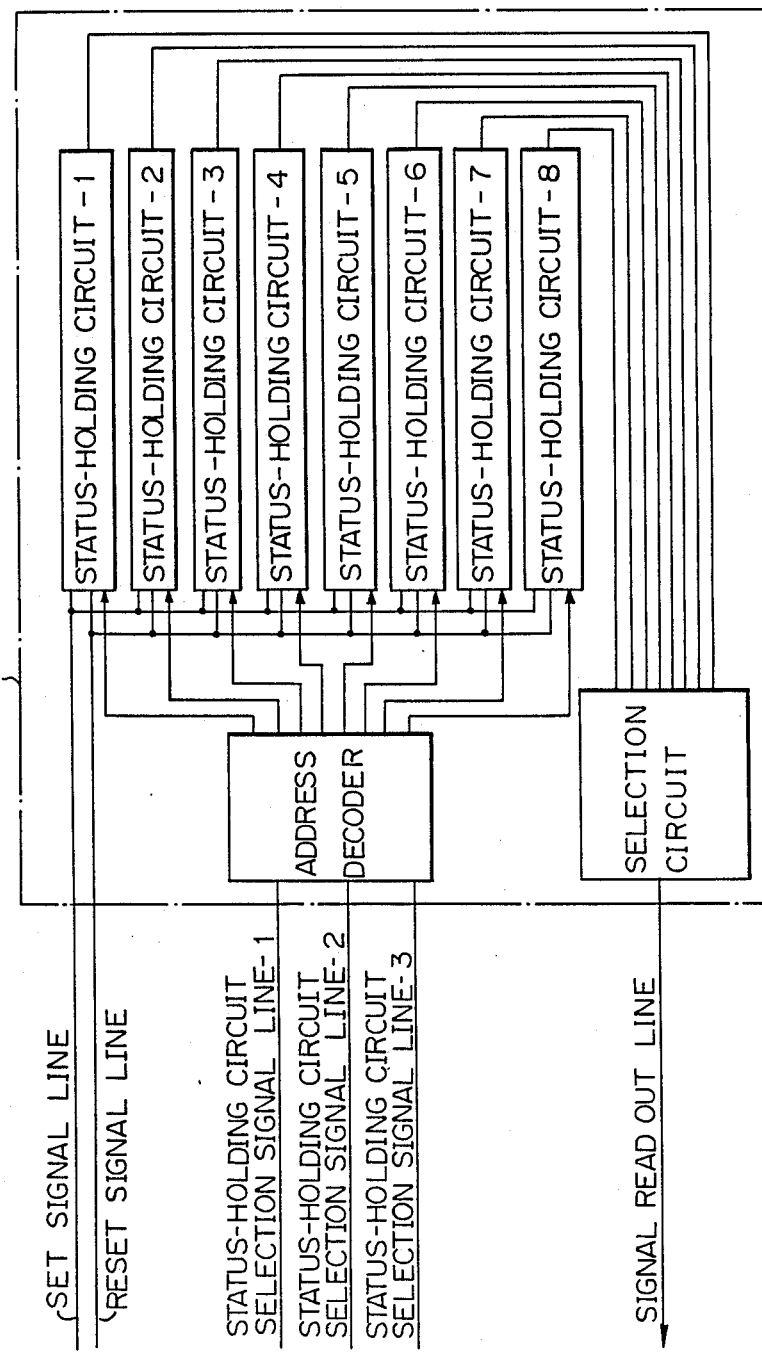
FIG. 2, shows a prior art parallel scanning system.

A prior art parallel scanning system is shown in FIG. 2. The system of FIG. 2 has an integrated circuit (A) which includes an address decoder, a selection circuit, and a plurality of status-holding circuits—1, —2, —3, —4, —5, —6, —7, and —8. Each of the status-holding circuits receives a set signal, a reset signal, and an output signal from the address decoder. The address decoder receives a selection signal through a plurality of status-holding circuit selection signal lines—1, —2, and —3. The number of status-holding circuit selection signal lines is equal to the number of bits which can express a scan address. By supplying the status-holding circuit selection signal lines with a scan address in parallel, the designation of one of the status-holding circuits to be scanned is designated.

However, in the system of FIG. 2, the address decoder is provided and, for example, at least 8 scan address signal lines for scanning 256 status-holding circuits must be provided. This increases the number of terminal pads and thus is disadvantageous.

Figure 3B:
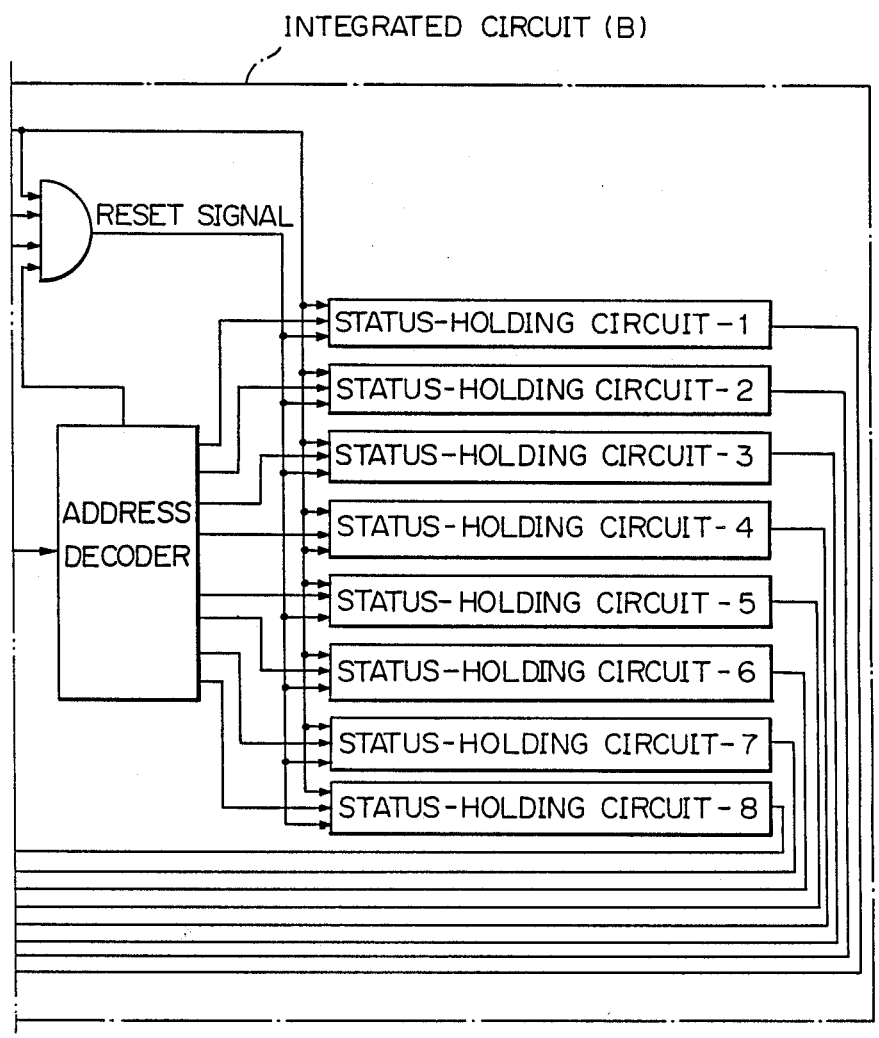
FIG. 3, comprised of FIGS. 3A and 3B, shows a prior art serial scanning system.

A prior art serial scanning system is shown in FIG. 3, the system of FIG. 3 has an integrated circuit (B) which includes a shift register, an address decoder, an AND gate, a selection circuit, and a plurality of status-holding circuits—1, —2, —3, —4, —5, —6, —7, and —8. Each of the status-holding circuits receives a set signal, a reset signal, and an output signal from the address decoder.

The shift register receives input signals, and the output of the shift register is supplied to the address decoder. The shift register has a serial/parallel conversion function. The AND gate receives a set signal, a shift-/count signal, a clock signal, and an output signal from the address decoder, and delivers a reset signal. In the system of FIG. 3, scan address signals are supplied in series through only one set of input lines (a), (b), and (c). The shift register holds the successively supplied scan address signals.

The address decoder receives the output signal of the shift register and generates parallel scan address signals to designate the status-holding circuit to be scanned.

However, in the system of FIG. 3, a number of shift registers must be provided exclusively for the scan address holding operation; the number of shift registers being equal to the number of bits which can express a scan address. Also, devices for the serial-parallel conversion of scan addresses must be provided. The increases in the hardware mainly due to shift registers is also disadvantageous, and the present invention is intended to eliminate these disadvantages of the prior arts.

Figure 4B:
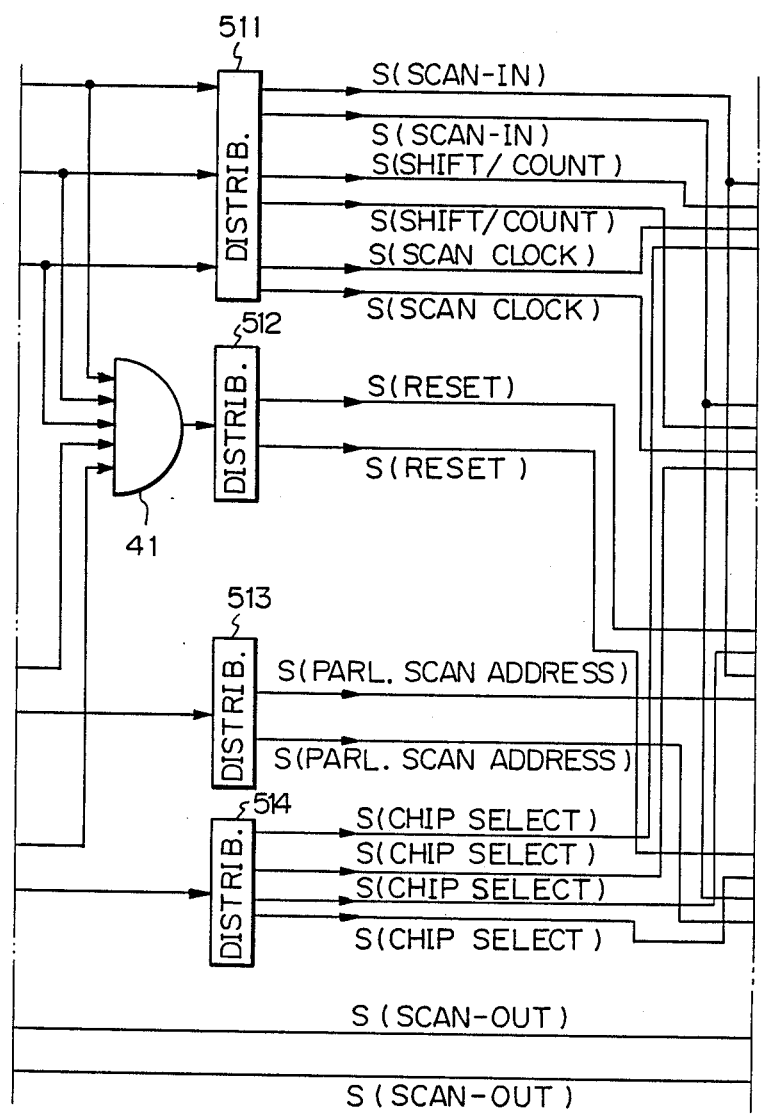
FIG. 4, comprised of FIGS. 4A, 4B and 4C, shows an electronic circuit device able to diagnose a status-holding circuit by scanning according to an embodiment of the present invention.
Figure 4C:
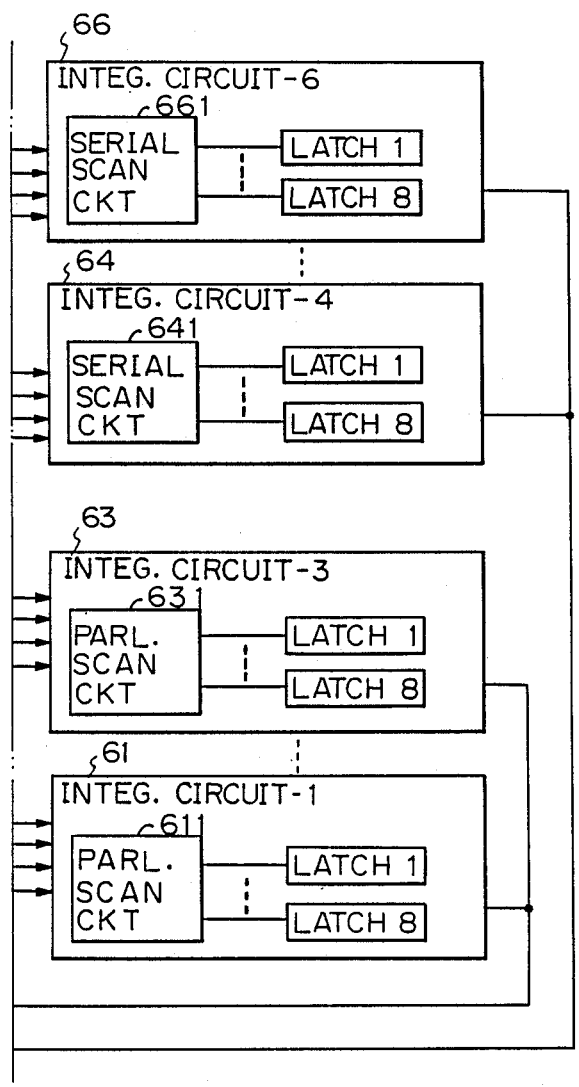

An electronic circuit device able to diagnose a status-holding circuit by scanning according to an embodiment of the present invention is shown in FIG. 4. In the device of FIG. 4, a plurality of large scale integrated circuits 61, 63, 64, and 66 are provided, each including status-holding circuits such as latch circuits, and a selector 81.

The device of FIG. 4 also includes a shifter/counter 21, and decoders 311, and 312, an AND gate 41, and distribution circuits 511, 512, 513, and 514.

The integrated circuits 66, and 64 are scanned in the serial scan method, the integrated circuits 63, and 61 scanned in the parallel scan method.

The shifter/counter 21 receives a status holding circuit setting signal, a shift/count signal, and a scan clock signal. The output latch address signals S(21-6), S(21-5), S(21-4), and S(21-3) are supplied to the decoder 311, and the output scan address signals S(21-2), S(21-1), and S(21-0) are supplied to the decoder 312.

The AND gate 41 receives the status holding circuit setting signal, the shift/count signal, the scan clock signal, the signal S(311-0), and the signal S(312-0); the distribution circuit 511 receives the status holding circuit setting signal, the shift/count signal, and the scan clock signal; the distribution circuit 512 receives the output from the AND gate 41; the distribution circuit 513 receives the signal S(311-1); and the distribution circuit 514 receives the signal S(312-1). It should be noted that, in FIG. 4, only one signal lines S(311-1) and S(312-1) are illustrated as the representatives of pluralities of signal lines S(311-1) and S(312-1).

Each of the integrated circuits 66 and 64 receives the scan-in signal, the shift/count signal, and the scan clock signal from the distribution circuit 511, and each of the integrated circuits 63 and 61 receives the reset signal from the distribution circuit 512, the chip select signal from the distribution circuit 514, the scan-in signal from the distribution circuit 511, and the parallel scan address signal from the distribution circuit 513.

The operation of the device of FIG. 4 will now be explained. The shifter/counter 21 operates as a shifter or a counter in accordance with the shift/count signal. When the shift/count signal is ON and the scan clock signal is ON, the shifter/counter 21 operates as a shifter to shift the content of the status hold circuit setting signal. When the shift/count signal is OFF and the scan clock signal is ON state, the shifter/counter 21 operates as a counter.

A scan address of any one of the integrated circuit—6, the integrated circuit—4, the integrated circuit—3, and the integrated circuit—1 for which a scan-in or scan-out is desired, is set in outputs S(21-2), S(21-1), and S(21-0) of the shifter/counter 21, and a latch address of the latch circuits in the integrated circuit—6, —4, —3, and —1 is set in the outputs S(21-6), S(21-5), S(21-4), and S(21-3) of the shifter/counter 21.

First, the operation where the target integrated circuit is the integrated circuit—1, and the target latch circuit is the first latch circuit in the integrated circuit—1 is explained as follows.

The shift/count signal is made ON, and the integrated circuit scan address, i.e., chip-select, is set so that the signal S(21-0) is 0, the signal S(21-1) is 0, and the signal S(21-2) is 1; the latch address, i.e., parallel scan address, is set so that the signal S(21-3) is 0, the signal S(21-4) is 0, the signal S(21-5) is 0, and the signal S(21-6) is 1; and, the shift/count signal is made OFF.

Under the above conditions, if a scan-in operation is to be carried out, the status hold circuit setting signal is made ON, and a rewriting of the latch in the target integrated circuit is carried out. If a scan-out operation is to be carried out, the status hold circuit setting signal is made OFF, the latch in the target integrated circuit is read via a scan-out signal through the selector 81, and the status hold circuit setting signal is distributed to all integrated circuits—6, —4, —3, and —1 as the scan-in signal.

The signals S(21-2), S(21-1), and S(21-0) from the shifter/counter 21 are distributed to the integrated circuit—1 and the integrated circuit—3 as the chip-select signal via the signal S(312-1) of the decoder 312, to select a single target integrated circuit, the signals S(21-6), S(21-5), S(21-4), and S(21-3) from the shifter/counter 21 are distributed to the latches in the integrated circuit—1 and —3 as the parallel scan address via the signal S(311-1) of the decoder 311, and the signal S(311-0) of the decoder 311 and the signal S(312-0) of the decoder 312 are distributed to the integrated circuit—1 and —3 as the reset signal generation.

Next, the operation where the target integrated circuit is the integrated circuit—6, and the target latch circuit is the eighth latch circuit in the integrated circuit—6 is explained as follows.

The signals S(21-6), S(21-5), S(21-4), and S(21-3) from the shifter/counter 21 and the signals from the decoder 311 and the signal from the AND gate 41 exist also in the serial scan circuit 661 (FIG. 6) in the integrated circuit—6.

Accordingly, the signals of the shifter/counter 21 in the serial scan circuit 661 corresponding to the signals S(21-6), S(21-5), S(21-4), and S(21-3) are set to "0", "0", "0", and "1", respectively, for the address of the target eighth latch circuit, and a scan-in or scan-out operation is carried out.

In the scan-out operation, one data is selected in the selector 81 based on the signal S(312-2) from the decoder 312 and this one data is read. In this connection, the signals S(312-1) and S(312-2) can be unified as a single signal.

The structure of the integrated circuits 66, 64, 63, and 61 in the device of FIG. 4 is shown in FIG. 5. Each of the integrated circuits 66 and 64 includes a serial scan circuit and a plurality of latch circuits, and each of the integrated circuits 63 and 61 includes a parallel scan circuit and a plurality of latch circuits.

Figure 6:
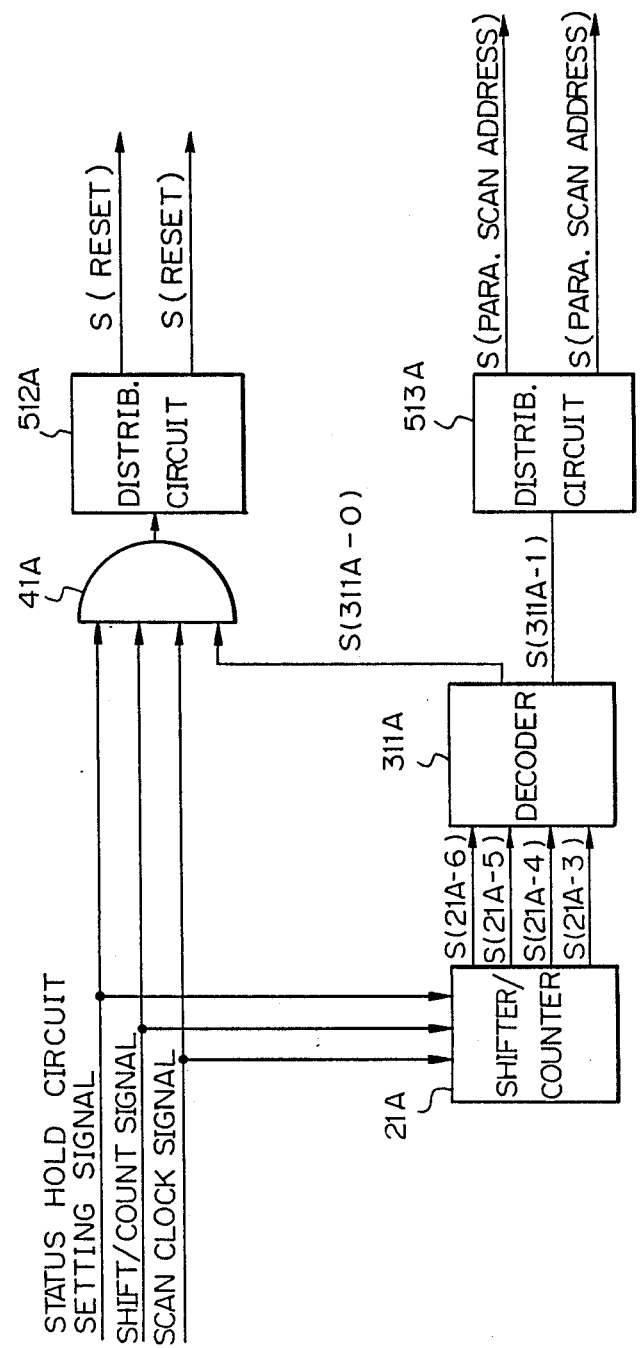
FIG. 6 shows the structure of a serial scan circuit in an integrated circuit in the device of FIG. 4.

The structure of a serial scan circuit in an integrated circuit in the device of FIG. 4 is shown in FIG. 6. The serial scan circuit includes a shifter/counter 21A, a decoder 311A, an AND gate 41A, a distribution circuit 512A, and a distribution circuit 513A.

Figures 7, 7A:
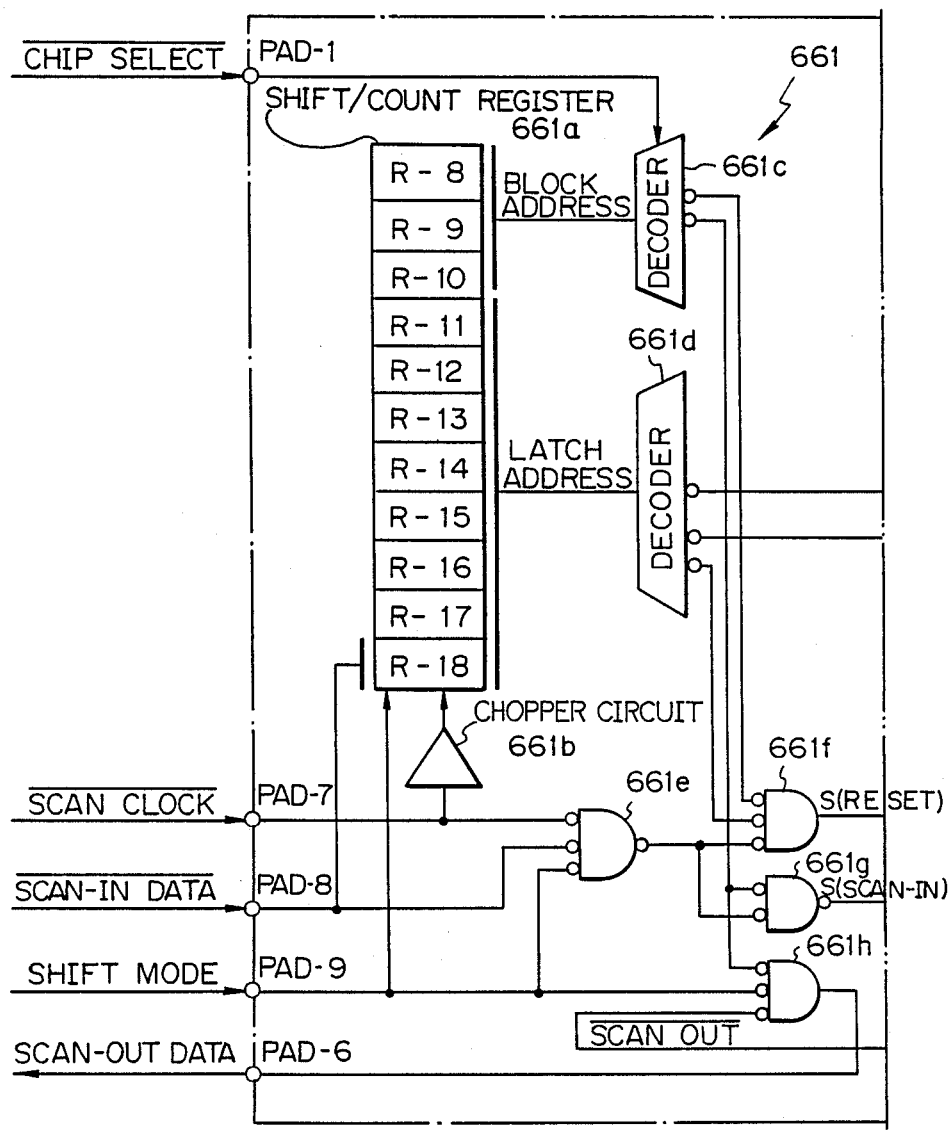
FIG. 7, comprised of FIGS. 7A and 7B, shows a detailed structure of a serial scan circuit as a portion of an integrated circuit in the device of FIG. 4.
Figure 7B:
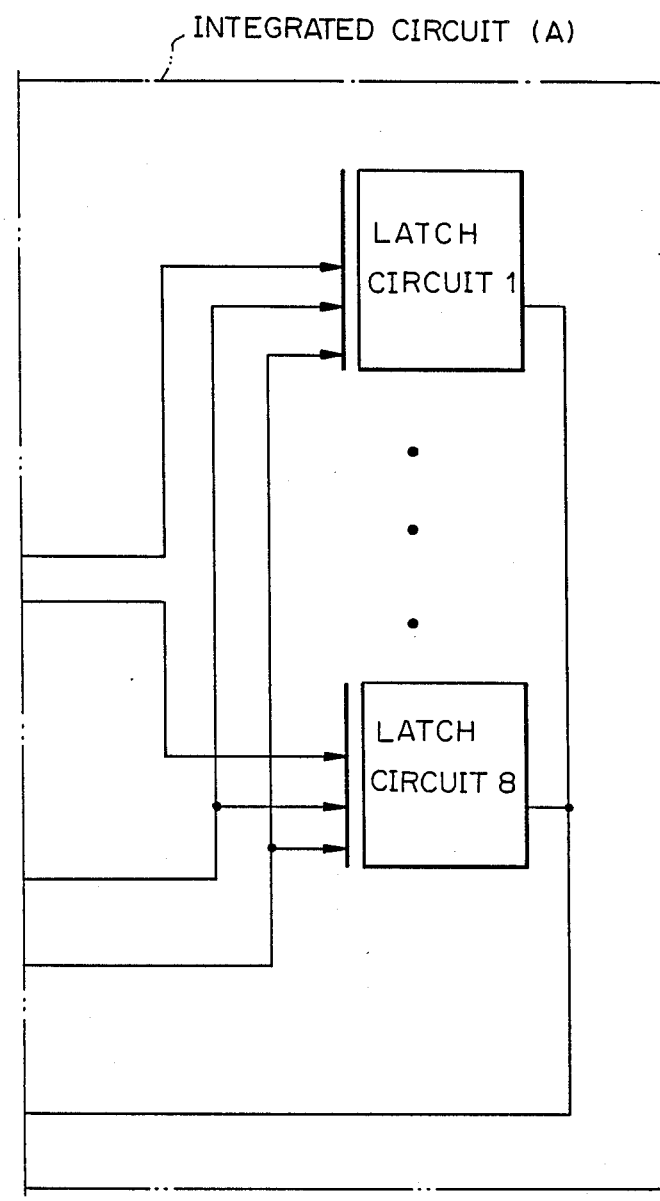

The detailed structure of a serial scan circuit as a portion of an integrated circuit in the device of FIG. 4 is shown in FIG. 7. The serial scan circuit includes a shift/count register 661a, a chopper circuit 661b, a decoder 661c, a decoder 661d, and gates 661e, 661f, 661g, and 661h, and terminal pads PAD-1, PAD-7, PAD-8, PAD-9, and PAD-6. The output signals from the decoder 661d, the gate 661f, and the gate 661g are supplied to the latch circuits LATCH CKT-1 through LATCH CKT-8 in the integrated circuits (A).

The PAD-1 receives the chip select signal $\overline{\text{CHIP SELECT}}$ (inverted CHIP SELECT); the PAD-7 receives the scan clock signal SCAN CLOCK; the PAD-8 receives the scan-in data SCAN-IN DATA; the PAD-9 receives the shift mode signal SHIFT MODE; and, the PAD-6 delivers the scan-out data SCAN-OUT DATA.

The decoder 661c receives the block address signal from the shift/count register 661a, and the decoder 661d receives the latch address signal from the shift/count register 661a. It should be noted that, in FIG. 7, the output lines of the decoders 661c and 661d are illustrated per one block as the representative of pluralities of the output lines for a plurality of blocks. Also, the output line of the gate 661h is illustrated per one block as the representative of a plurality of the output lines for a plurality of blocks.

The operation of the device of FIG. 7 will now be explained. When the shift mode signal SHIFT MODE is "1", the shift/count register 661a is operated as a shift register, and the scan-in data SCAN-IN DATA received by the PAD-8 is taken bit by bit into the shift/count register 661a based on the scan clock signal SCAN CLOCK. The block address is registered in the sections R-8, R-9, and R-10, and the latch address is registered in the sections R-11 through R-18. When the shift-mode signal SHIFT MODE is "0", the shift/count register 661a is operated as a counter, and the scan clock signal SCAN CLOCK is counted.

Accordingly, the shift/count register 661a first takes the scan-in data, and then operates as a counter, so that the shift/count register 661a carries out successive increments from the scan-in data as the initial value.

Where a sequence of numbers is assigned to latch addresses of the latches in each of the blocks, a shift-in of the address of a latch of a block is carried out followed by the increment of this address, and accordingly, the addresses of the following latches are successively generated without a shift-in of the addresses of the following latches from outside. This shows the advantage gained by the provision of the shift/count register 661a.

When the chip select signal CHIP SELECT is supplied to the PAD-1, the present integrated circuit (A) is selected. When a shift-in of the block address and the latch address for a latch in the present integrated circuit (A) is carried out, this latch is selected so that an input of data into and a take-out of data from this latch can be carried out. The RESET signal is generated from the gate 661f. The BLOCK SCAN-IN signal is generated from the gate 661g. The output of the gate 661e which receives the signals through the PAD-7, PAD-8, and PAD-9 is supplied to the gates 661f and 661g. The PAD-8 also can be used for receiving the data to be input to the latch.

In the device of FIG. 7, the number of pads of the integrated circuit (A) is greatly reduced, and since usually a great number of integrated circuits is used, the thus enabled reduction of the total number of pads is an advantageous affect.

Figure 8:
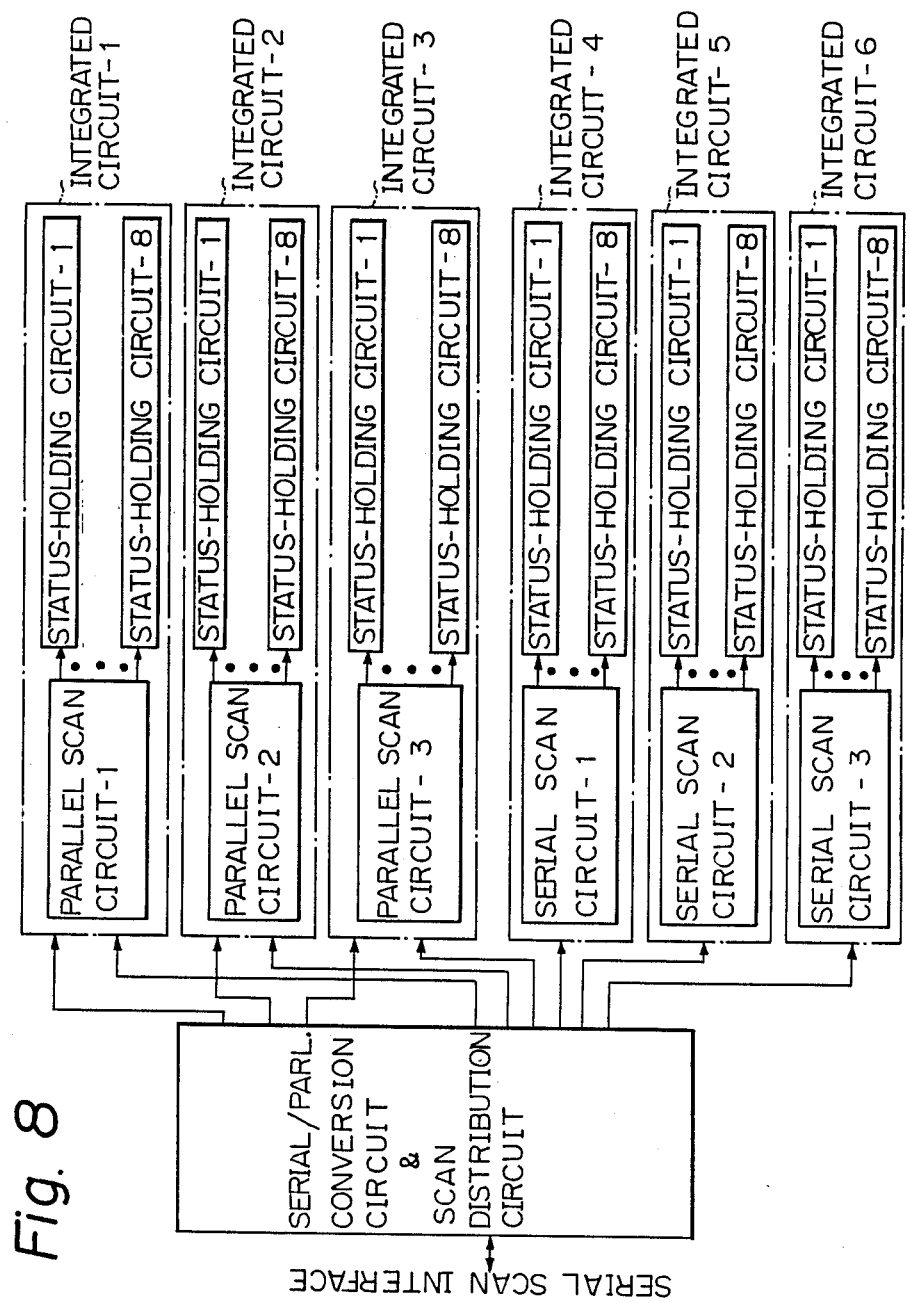
FIG. 8 illustrates a model expression of the device of FIG. 4.

From the functional viewpoint, the device of FIG. 4 can be expressed as a model shown in FIG. 8. The model of FIG. 8 is constituted by a plurality of integrated circuits each having a parallel scan circuit and a plurality of status-holding circuits, a plurality of integrated circuits each having a serial scan circuit and a plurality of status-holding circuits, and a serial/parallel conversion circuit and scan distribution circuit which is connected with a serial scan interface.

Figure 9B:
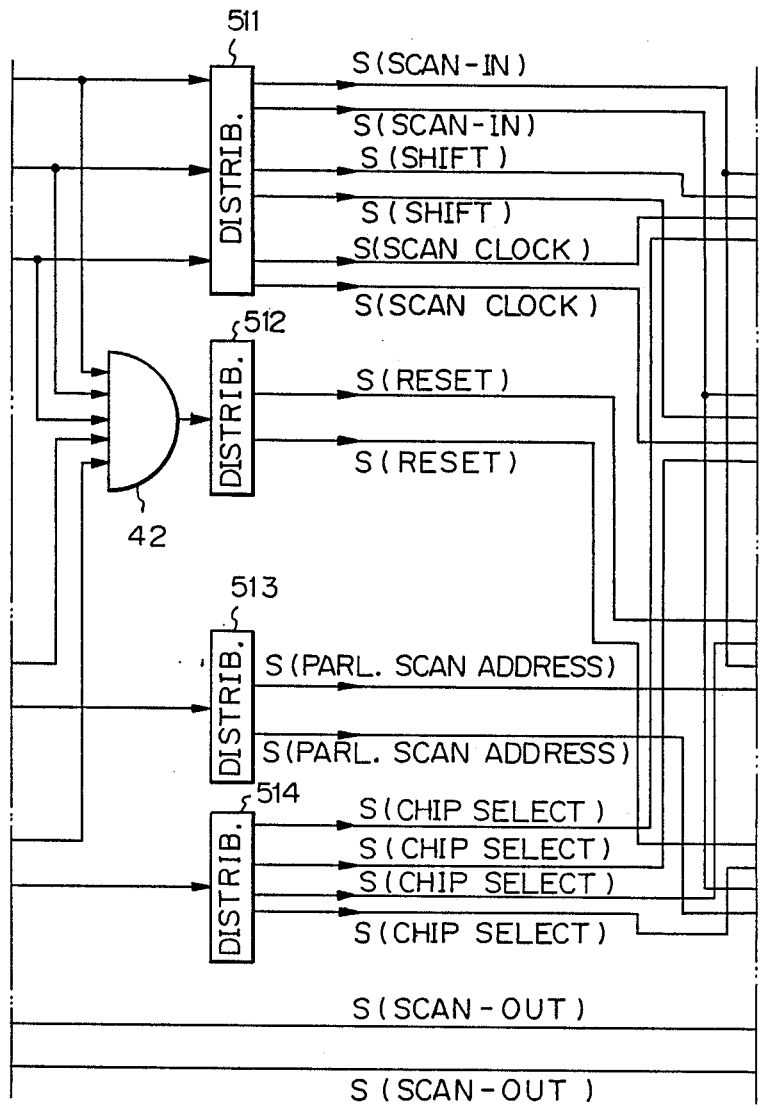
FIG. 9, comprised of FIGS. 9A, 9B and 9C, shows an electronic circuit device able to diagnose a status-holding circuit by scanning according to another embodiment of the present invention.
Figure 9C:
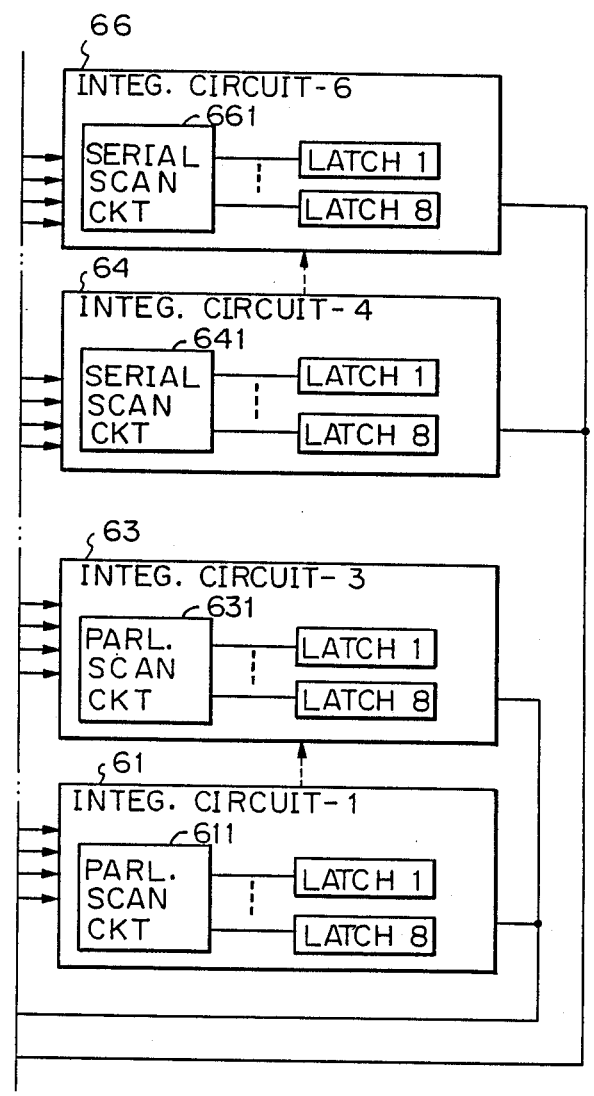

An electronic circuit device able to diagnose a status-holding circuit by scanning according to another embodiment of the present invention is shown in FIG. 9. In the device of FIG. 9, a plurality of large scale integrated circuits 61, 63, 64, and 66, each including status-holding circuits, such as latch circuits, and a selector 82, are provided.

The device of FIG. 9 includes a parallel scan address register 22, a counter 23, a selector 24, a selector 25, a decoder 321, a decoder 322, an AND gate 42, and distribution circuits 511, 512, 513, and 514.

The integrated circuits 66 and 64 are scanned, in series, and the integrated circuits 63 and 61 are scanned in parallel.

The parallel scan address register 22 receives the scan clock signal and the parallel scan address signal. The output signals S(22-6), S(22-5), S(22-4), and S(22-3) are supplied to the decoder 321, and the output signals S(22-2), S(22-1), and S(22-0) are supplied to the decoder 322.

The counter 23 receives the scan clock signal and the parallel scan mode signal and the selector 24 receives the signal from the counter 23 and the signals S(22-6), S(22-5), S(22-4), and S(22-3). The selector 25 selects the status holding circuit and receives the signal from the selector 24, and is controlled by the signal from the counter 23.

The AND gate 42 receives the signal from the selector 25, the signal from the counter 23, the counter clock signal from the counter 23, an output signal from the decoder 321, and an output signal from the decoder 322; the distribution circuit 511 receives the signal from the selector 25, the signal from the counter 23, and the counter clock signal from the counter 23; the distribution circuit 512 receives the output from the AND gate 42; the distribution circuit 513 receives a signal from the decoder 321; and, the distribution circuit 514 receives a signal from the decoder 322.

The input signals of the integrated circuits 66, 64, 63, and 61 are similar to those in the device of FIG. 5.

The operation of the device of FIG. 9 will now be explained. The parallel scan address having a bit width of, for example, 7 bits, is supplied to the parallel scan address register 22. When the scan clock signal is ON, the parallel scan address register 22 is set.

Where a parallel-to-serial conversion is carried out, the counter 23 is operated by the scan clock signal and the parallel scan mode signal. The signals S(22-6), S(22-5), S(22-4), and S(22-3) from the parallel scan address register 22 supplied to the selector 24 are selected by the signal from the counter 23 through the selector 24, the selector 25, and the distribution circuit 511 and are transmitted serially as scan-in signals. The shift signal is made ON when the value of the counter 23 is not zero. The counter clock signal from the counter 23 is distributed as scan clock signals to the integrated circuits which are scanned in series.

The counter 23 continues to count up until 4 bit signal S(22-6), S(22-5), S(22-4), and S(22-3) is transmitted, and returns to the value zero when this transmission is completed.

Thus, a scan-in operation or a scan-out operation for a single latch circuit in the target integrated circuit which is scanned in series is carried out by the scan-in signal, the shift signal, and the scan clock signal as described above.

As a further embodiment of the present invention, it is possible to combine the device of FIG. 4 and the device of FIG. 9.

We claim:

1. An electronic circuit device able to diagnose a status-holding circuit by scanning, said device comprising:

a first plurality of integrated circuits each including a serial scan circuit and a plurality of status-holding circuits to be scanned, said serial scan circuit receiving serial data, generating an address value of a target status-holding circuit as parallel data from the received serial data, and selecting the target status-holding circuit having the generated address value;

a second plurality of integrated circuits each including a parallel scan circuit and a plurality of status-holding circuits to be scanned, said parallel scan circuit receiving an address value of a target status-holding circuit as parallel data and selecting the target status-holding circuit having the received address value;

a serial-parallel converter means for receiving a serially supplied address signal and converting the received signal into a parallel address signal, a first decoder means, connected to said serial-parallel converter means, for decoding a first part of said parallel address signal and providing a plurality of chip select signals each corresponding to one of said first and second plurality of integrated circuits, respectively;

a first distributing means for receiving a second part of said parallel address signal and distributing this second part to each of said second plurality of integrated circuits, and a second distributing means for receiving said serially supplied address signal and distributing this signal to each of said first plurality of integrated circuits.

2. A device according to claim 1, further comprising a shifter/counter for receiving a status-holding circuit setting signal, a shift/count signal, and a scan clock signal and generating status-holding circuit address signals and scan address signals to be supplied to said plurality of distribtion circuits through decoder and logic gate means.

3. A device according to claim 1, wherein said serial scan circuit comprises a plurality of pads for receiving a scan clock signal, a scan-in data, and a shift mode signal, a shift/count register, a block address decoder and a status-holding circuit address decoder.

4. A device according to claim 3, wherein a reset signal for the status-holding circuit is generated based on the scan clock signal, the scan-in data, and the shift mode signal received through said plurality of pads.

5. A device according to claim 3, wherein said shift-/count register is able to be operated as a shift register by said shift mode signal to take in a block address and a status-holding circuit address as scan-in data based on the scan clock signal, and said decoder is able to decode the signals from said shift/count register to carry out a status-holding circuit selection.

6. A device according to claim 3, wherein said shift-/count register is able to be operated as a counter by said shift mode signal to count the scan clock signal, and the generate addresses of the following status-holding circuits to enable the selection of the following status-holding circuits.

7. An electronic circuit device able to diagnose a status-holding circuit by scanning, said device comprising:
 a first plurality of integrated circuits each including a serial scan circuit and a plurality of status-holding circuits to be scanned, said serial scan circuit receiving serial data, generating an address value of a target status-holding circuit as parallel data from the received serial data, and selecting the target status-holding circuit having the generated address value;
 a second plurality of integrated circuits each including a parallel scan circuit and a plurality of status-holding circuits to be scanned, said parallel scan circuit receiving an address value of a target status-holding circuit as parallel data and selecting the target status-holding circuit having the received address value;
 a parallel-serial converting means for converting a first part of a supplied parallel address signal into a serial address signal;
 a first distributing means for distributing said serial address signal to each of said first plurality of integrated circuits;
 a first decoder means for decoding a second part of said supplied parallel address signal and providing a plurality of chip select signals each corresponding to one of said first and second plurality of integrated circuits, respectively; and
 a second distributing means for receiving said first part of the supplied parallel address and distributing this first part to each of said second plurality of integrated circuits.

8. A device according to claim 7, further comprising a parallel scan address register for receiving a parallel scan address signal and a scan clock signal and generating status-holding circuit address signals and scan address signals, and a counter or receiving a parallel scan mode signal and a scan clock signal and generating output signals corresponding to results of the counting, status-holding circuit address signals and scan address signal generated in said parallel scan address register being supplied to said plurality of distribution circuits through decoder and logic gate means.

9. A device according to claim 8, wherein the output signals generated in said counter are supplied to said plurality of distribution circuits through selector and logic gate means.

10. A device according to claim 7, wherein said serial scan circuit comprises a plurality of pads for receiving a scan clock signal, a scan-in data, and a shift mode signal, a shift/count register, a block address decoder and a status-holding circuit address decoder.

11. A device according to claim 10, wherein a reset signal for the status-holding circuit is generated based on the scan clock signal, the scan-in data, and the shift mode signal received through said plurality of pads.

12. A device according to claim 10, wherein said shift/count register is able to be operated as a shift register by said shift mode signal to take in a block address and a status-holding circuit address as scan-in data based on the scan clock signal, and said decoder is able to decode the signals from said shift/count register to carry out a status-holding circuit selection.

13. A device according to claim 10, wherein said shift/count register is able to be operated as a counter by said shift mode signal to count the scan clock signal, and to generate addresses of the following status-holding circuits to enable the selection of the following status-holding circuits.

* * * * *